(12) United States Patent
Chen et al.

(10) Patent No.: US 11,061,333 B2
(45) Date of Patent: Jul. 13, 2021

(54) MANUFACTURING METHOD OF SEMICONDUCTOR DEVICE AND SEMICONDUCTOR PROCESSING SYSTEM

(71) Applicant: Taiwan Semiconductor Manufacturing Co., Ltd., Hsinchu (TW)

(72) Inventors: Yu-Kai Chen, Kaohsiung (TW); Chia-Hung Chung, Tainan (TW); Ko-Bin Kao, Taichung (TW); Su-Yu Yeh, Tainan (TW); Li-Jen Wu, Tainan (TW); Zhi-You Ke, Kaohsiung (TW); Ming-Hung Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 182 days.

(21) Appl. No.: 15/905,739

(22) Filed: Feb. 26, 2018

(65) Prior Publication Data

US 2019/0146348 A1    May 16, 2019

Related U.S. Application Data

(60) Provisional application No. 62/584,921, filed on Nov. 13, 2017.

(51) Int. Cl.
*G03F 7/20* (2006.01)
*G03F 7/40* (2006.01)
(Continued)

(52) U.S. Cl.
CPC .............. *G03F 7/40* (2013.01); *G03F 7/0046* (2013.01); *G03F 7/039* (2013.01); *G03F 7/0392* (2013.01);
(Continued)

(58) Field of Classification Search
CPC .......... H01L 21/0274; H01L 21/30604; H01L 21/31053; H01L 21/02664;
(Continued)

(56) References Cited

U.S. PATENT DOCUMENTS 6,096,267 A    8/2000  Kishkovich et al.
6,399,518 B1   6/2002  Ueda
(Continued)

FOREIGN PATENT DOCUMENTS

CN    202803734    3/2013
CN    204065662    12/2014
(Continued)

OTHER PUBLICATIONS

"Office Action of Taiwan Counterpart Application," dated Jul. 8, 2019, p. 1-p. 5.
(Continued)

*Primary Examiner* — Mesfin T Asfaw
(74) *Attorney, Agent, or Firm* — JCIPRNET

(57) ABSTRACT

A method of manufacturing a semiconductor device and a semiconductor processing system are provided. The method includes the following steps. A photoresist layer is formed on a substrate in a lithography tool. The photoresist layer is exposed in the lithography tool to form an exposed photoresist layer. The exposed photoresist layer is developed to form a patterned photoresist layer in the lithography tool by using a developer. An ammonia gas by-product of the developer is removed from the lithography tool.

20 Claims, 6 Drawing Sheets

(51) Int. Cl.
*H01L 21/027* (2006.01)
*H01L 21/66* (2006.01)
*G03F 7/039* (2006.01)
*G03F 7/004* (2006.01)
*G03F 7/32* (2006.01)
*G03F 7/16* (2006.01)
*G03F 7/30* (2006.01)
*H01L 29/66* (2006.01)
*H01L 21/67* (2006.01)
*H01L 29/78* (2006.01)

(52) U.S. Cl.
CPC .............. *G03F 7/16* (2013.01); *G03F 7/20* (2013.01); *G03F 7/3092* (2013.01); *G03F 7/322* (2013.01); *H01L 21/0274* (2013.01); *H01L 22/10* (2013.01); *H01L 21/67017* (2013.01); *H01L 21/67253* (2013.01); *H01L 29/66568* (2013.01); *H01L 29/78* (2013.01)

(58) Field of Classification Search
CPC ......... H01L 21/31111; H01L 21/31116; H01L 21/0228; H01L 21/0338; H01L 21/3065; H01L 21/31055; H01L 21/31138; H01L 21/47635; H01L 21/76826; H01L 21/02068; H01L 29/401; H01L 21/02252; H01L 21/0272; H01L 21/3088; H01L 21/10; H01L 27/14685; H01L 22/10; H01L 29/66568; H01L 21/67017; H01L 21/67253; G03F 7/16; G03F 7/0392; G03F 7/26; G03F 7/40; G03F 1/80; G03F 7/20; G03F 7/32; G03F 1/46; G03F 7/0025; G03F 7/0035; G03F 7/70; G03F 7/3092; G03F 7/039; G03F 7/0046; G03F 7/322; G03F 7/78
See application file for complete search history.

(56) References Cited

U.S. PATENT DOCUMENTS

| | | | | |
|---|---|---|---|---|
| 2006/0024622 | A1* | 2/2006 | Tateyama | G03D 3/06 430/398 |
| 2015/0309414 | A1* | 10/2015 | Chen | G03F 7/38 430/325 |
| 2017/0092497 | A1* | 3/2017 | Yu | G03F 7/30 |

FOREIGN PATENT DOCUMENTS

| | | |
|---|---|---|
| CN | 105204294 | 12/2015 |
| JP | 2001230196 | 8/2001 |
| KR | 19980028359 | 7/1998 |
| KR | 20000077388 | 12/2000 |
| TW | 421843 | 2/2001 |
| TW | 201635026 | 10/2016 |
| TW | I554829 | 10/2016 |

OTHER PUBLICATIONS

"Office Action of China Counterpart Application," dated Mar. 27, 2020, p. 1-p. 11.

"Office Action of Korea Counterpart Application," dated Mar. 24, 2020, p. 1-p. 7.

* cited by examiner

MANUFACTURING METHOD OF SEMICONDUCTOR DEVICE AND SEMICONDUCTOR PROCESSING SYSTEM

CROSS-REFERENCE TO RELATED APPLICATION

This application claims the priority benefit of U.S. provisional application Ser. No. 62/584,921, filed on Nov. 13, 2017. The entirety of the above-mentioned patent application is hereby incorporated by reference herein and made a part of this specification.

BACKGROUND

Semiconductor devices are widely used in a variety of electronic applications, such as personal computers, cell phones, digital cameras, and other electronic equipment, as examples. Lithography is one of the important technologies commonly used during the manufacturing of the semiconductor devices. During lithography processes, by-products may be generated following the formation of the photoresist materials and the removal of the photoresist materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
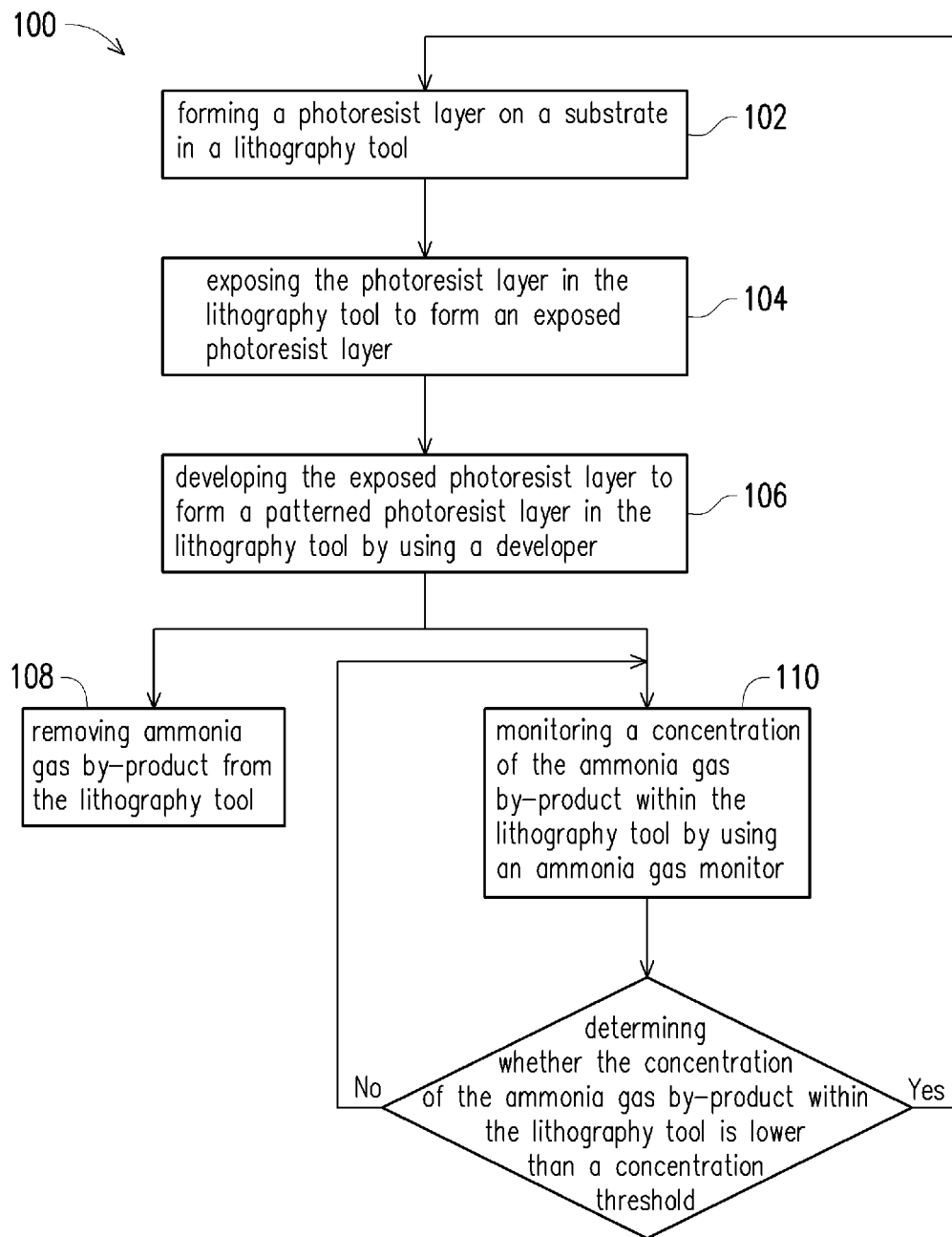
FIG. 1 is a flow chart showing the process steps of a manufacturing method for manufacturing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart showing the process steps of a manufacturing method 100 for manufacturing a semiconductor device in accordance with some embodiments of the present disclosure. The method 100 includes performing the process step 102 in which a photoresist layer is formed on a substrate in a lithography tool. In some embodiments, the material of the photoresist layer is a positive type photoresist. In some embodiments, the material of the photoresist layer includes poly (4-t-butoxycarbonyloxystyrene), polymethylmethacrylate (PMMA), tetrafluoroethylene (TFE), or other suitable photoresist materials. In the process step 104, the photoresist layer is exposed in the lithography tool to form an exposed photoresist layer. In the process step 106, the exposed photoresist layer is developed by using a developer to form a patterned photoresist layer in the lithography tool. In some embodiments, the developer includes an alkaline-based developer. In some embodiments, the developer includes an ammonium-containing developer. In some embodiments, the developer includes an aqueous solution of tetramethylammonium hydroxide (TMAH). In the process step 108, an ammonia gas by-product is removed from the lithography tool. In some embodiments, the operation of removing the ammonia gas by-product of the developer from the lithography tool (process step 108) may be performed after the operation of developing the exposed photoresist layer (process step 106). The method 100 may further include monitoring a concentration of the ammonia gas by-product in the lithography tool by using an ammonia gas monitor as shown in the process step 110. In some embodiments, the operation of removing the ammonia gas by-product of the developer from the lithography tool (process step 108) and the operation of monitoring a concentration of the ammonia gas by-product in the lithography tool by using an ammonia gas monitor (process step 110) may be performed at the same time. In alternative embodiments, the process step 108 and the process step 110 may be performed in sequence. The method 100 of manufacturing the semiconductor device described according to embodiments of the present disclosure may be part of the semiconductor manufacturing processes for fabricating a semiconductor device, and the method 100 may be used to pattern photosensitive material layers, masking layers, or any suitable material layers over a semiconductor substrate or semiconductor wafer. The details of the method 100 are further illustrated in FIGS. 2A-2F and FIG. 3 described in following paragraphs.

FIGS. 2A-2F are schematic cross-sectional views showing a semiconductor device at various stages of a manufacturing method for manufacturing the semiconductor device in accordance with some embodiments of the present disclosure. FIG. 3 is a schematic diagram showing a semiconductor processing system 30 in accordance with some embodiments of the present disclosure. The semiconductor processing system 30 in FIG. 3 may be utilized at certain stages during the operation of the manufacturing method for manufacturing the semiconductor device of FIGS. 2A-2F. The semiconductor processing system 30 of FIG. 3 may be referred for illustration purposes when the manufacturing method as shown in FIGS. 2A-2F is described. It is to be noted that the process steps described herein may cover a portion of the manufacturing processes used to fabricate a semiconductor device.

Figure 2A:
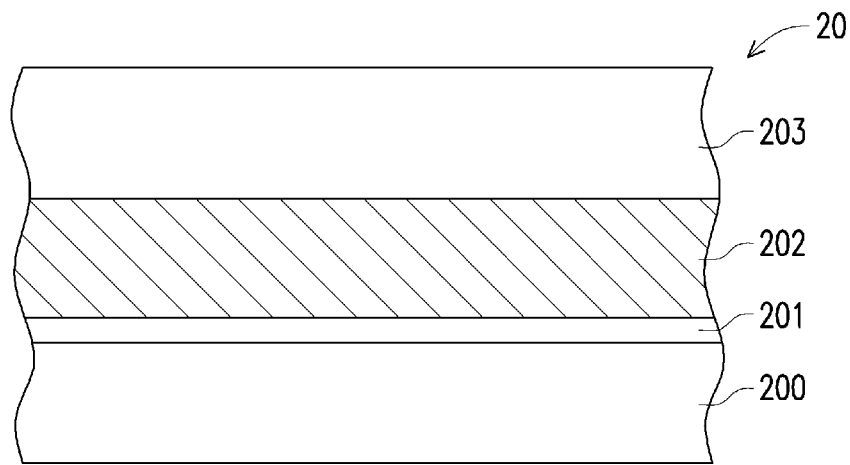
FIGS. 2A-2F are schematic cross-sectional views showing a semiconductor device at various stages of a manufacturing method for manufacturing the semiconductor device in accordance with some embodiments of the present disclosure.
Figure 3:
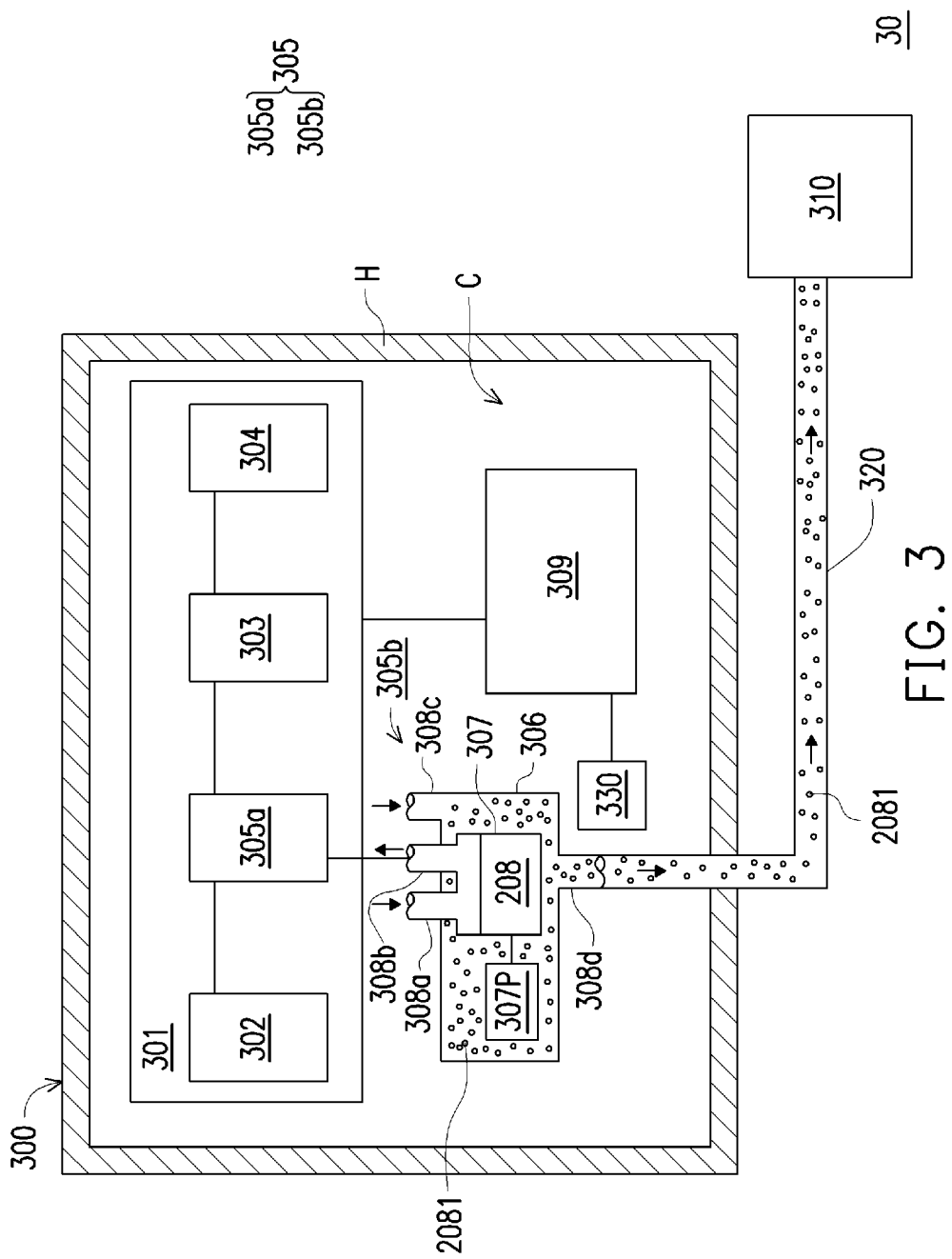
FIG. 3 is a schematic diagram showing a semiconductor processing system in accordance with some embodiments of the present disclosure.

FIG. 2A is a schematic cross-sectional view of the semiconductor device 20 at one of various stages of the manufacturing method, and FIG. 3 is a schematic diagram showing the semiconductor processing system 30 used for the manufacturing method of FIG. 2A. Referring to FIG. 2A, a substrate 200 is provided. In some embodiments, the substrate 200 comprises a crystalline silicon substrate. In some embodiments, the substrate 200 is part of a silicon bulk wafer. The silicon bulk wafer may include interconnection structures (not shown) formed with patterned dielectric layers and patterned conductive layers stacked together. In some embodiments, the substrate 200 may comprise other features such as various doped regions, a buried layer, and/or an epitaxy layer. In certain embodiments, the doped regions are doped with p-type and/or n-type dopants depending design requirements (e.g., p-type substrate or n-type substrate). In some alternative embodiments, the substrate 200 is made of other suitable elemental semiconductor, such as germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, in the process step 102 and as shown in FIG. 2A, a photoresist layer 203 is formed on the substrate 200. In some embodiments, the photoresist layer 203 is formed on the substrate 200 within a coating unit 302 of a lithography tool 300 within the semiconductor processing system 30. That is, the coating unit 302 is configured to coat the photoresist layer 203 on the substrate 200. In some embodiments, the photoresist layer 203 is formed by performing a spin coating process, a spray coating process, a dip coating process or a roller coating process. In certain embodiments, after forming the photoresist layer 203 by, for example, spin coating within the coating unit 302, the photoresist layer 203 is heated by performing a pre-baking process within a baking unit 303 of the lithography tool 300. At this point, the baking unit 303, which may include a hotplate, is configured to dry up the photoresist layer 203 and thereby removes excess solvent from the photoresist layer 203. In some embodiments, the material of the photoresist layer 203 is a positive type photoresist material. The exposed portion of the positive type photoresist layer becomes soluble to the later applied developer, while the unexposed areas of the positive type photoresist layer remain on the substrate. In some embodiments, the photoresist layer 203 is a positive type photoresist layer, the portion of the photoresist layer 203 that is exposed to a radiation will be removed by a developer. In some embodiments, the material of the positive type photoresist includes poly (4-t-butoxycarbonyloxystyrene), polymethylmethacrylate (PMMA) or tetrafluoroethylene (TFE). In some embodiments, the material of the positive type photoresist includes a mixture of diazonaphthoquinone (DNQ) and novolac resin.

In some embodiments, before the photoresist layer 203 is formed on the substrate 200, a dielectric material layer 201 and a gate material layer 202 are sequentially formed on the substrate 200. That is, the photoresist layer 203 is disposed over the gate dielectric material layer 202. In some embodiments, the dielectric material layer 201 includes $SiO_2$, $SiO_x$, SiN, other dielectric materials, or combinations thereof or multiple layers thereof. In some embodiments, the dielectric material layer 201 is formed by chemical vapor deposition (CVD), atomic layer deposition (ALD), physical vapor deposition (PVD) or other methods. In some embodiments, the material of the gate material layer 202 includes polysilicon or doped silicon. In some embodiments, the material of the gate material layer 202 includes a metal-containing material, such as Al, Cu, W, Co, Ti, Ta, Ru, TiN, TiAl, TiAlN, TaN, TaC, NiSi, CoSi or a combination thereof. In some embodiments, the gate material layer 202 is formed by PVD, CVD, sputtering, plating or other suitable methods. In some embodiments, the thickness or the pattern of the dielectric material layer 201 and/or the gate material layer 202 may be modified based on the function or desired properties of the semiconductor device 20 desired.

Figure 2B:
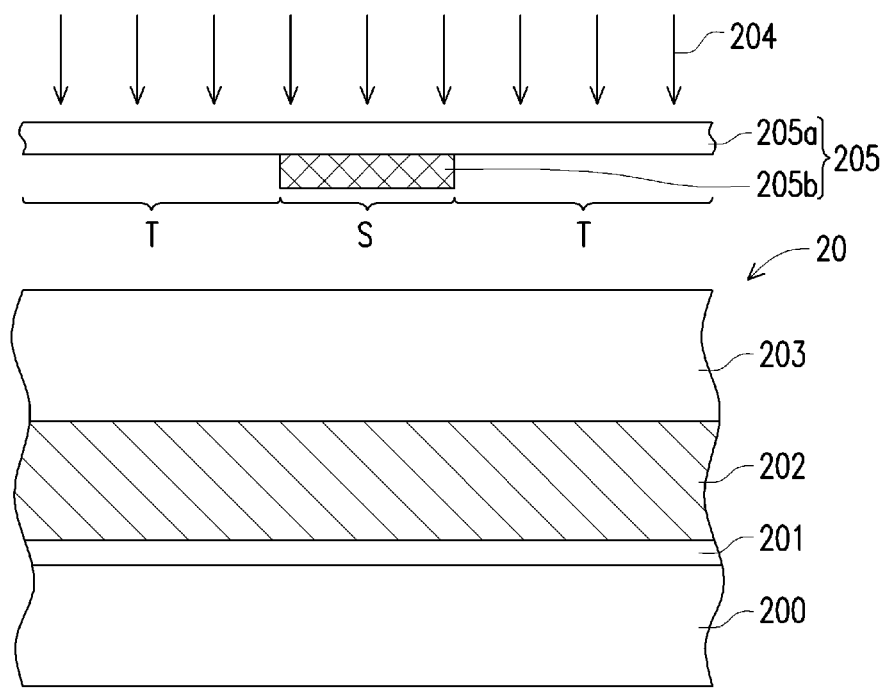
Figure 2C:
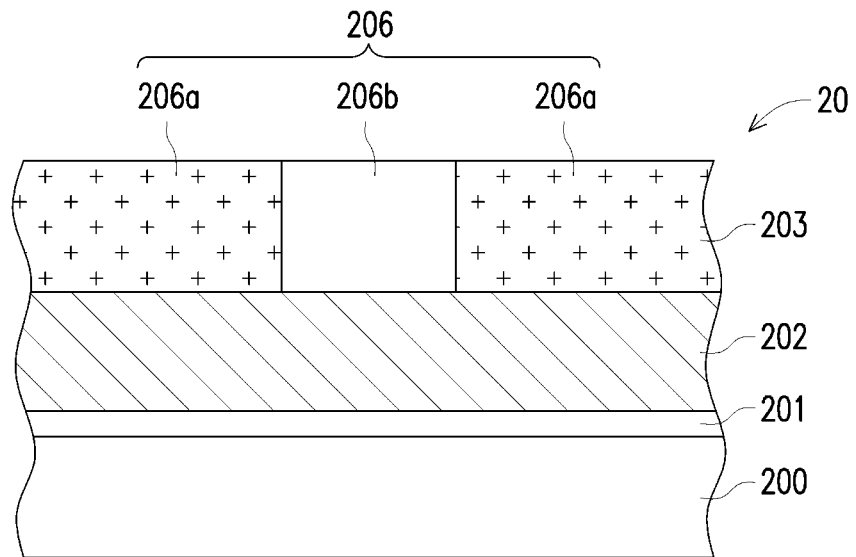

FIGS. 2B-2C are schematic cross-sectional views of the semiconductor device 20 at various stages of the manufacturing method. For illustration purposes, the semiconductor processing system 30 of FIG. 3 may be referred to. Referring to FIG. 2B and FIG. 2C, in the process step 104, the photoresist layer 203 is exposed to a radiation beam 204 to form an exposed photoresist layer 206. In some embodiments, the operation of exposing the photoresist layer 203 is performed within an exposure unit 304 of the lithography tool 300 within the semiconductor processing system 30. That is, the exposure unit 304 is configured to apply a radiation beam 204 and perform an exposure process to the photoresist layer 203, so that the photoresist layer 203 is transformed into an exposed photoresist layer 206. As illustrated in FIG. 2B, after providing a photomask 205 above the photoresist layer 203, the radiation beam 204 is applied to the photoresist layer 203 with the photomask 205 located between the radiation beam 204 and the photoresist layer 203. In some embodiments, the radiation beam 204 includes electron beam, ion beam, x-ray, extreme ultraviolet light, deep ultraviolet light, a KrF excimer laser (248 nm), an ArF excimer laser (193 nm), and/or F2 excimer laser (157 nm). In some embodiments, the photomask 205 includes a transparent substrate 205a and a radiation absorption layer 205b disposed on the transparent substrate 205a. That is, the region of the transparent substrate 205a where the radiation absorption layer 205b is disposed on is a shading region S, and the region of the transparent substrate 205a where no radiation absorption layer 205b is disposed thereon is a transparent region T. In one embodiment, the material of the transparent substrate 205a includes fused silica, calcium fluoride, or other suitable material. In one embodiment, the radiation absorption layer 205b is formed by depositing a metal film such as a film made of chromium and iron oxide on the transparent substrate 205a. In one embodiment, the radiation beam 204 travels through the transparent region T of the transparent substrate 205a and reaches the underlying photoresist layer 203. In alternative embodiments, the photomask 205 includes a binary mask, a phase shift mask (PSM), or an optical proximate correction (OPC) mask. As illustrated in FIG. 2B, a portion of the photoresist layer 203 on the substrate 200 is exposed to the radiation beam 204 passing through the transparent region T of the photomask 205. In some embodiments, the operation of exposing the photoresist layer 203 is implemented using a stepper by a step-and-repeat method or using a scanner by a step-and-scan method. In some embodiments, a pattern could be transferred to the photoresist layer 203 according to the predefined pattern of the photomask 205. However, the present disclosure is not limited to it. In alternative embodiments, the operation of exposing the photoresist layer 203 may include other technologies such as a mask-free exposure process.

As illustrated in FIG. 2C, after the photoresist layer 203 is exposed through the exposure process, the exposed photoresist layer 206 has an exposed portion 206a and an unexposed portion 206b. As aforementioned, the exposed portion 206a of the exposed photoresist layer 206 becomes soluble to the subsequently applied developer. In some embodiments, after the exposure process and obtaining the exposed photoresist layer 206, the exposed photoresist layer 206 is further heated and baked by performing a baking process within the baking unit 303 of the lithography tool 300.

Figure 2D:
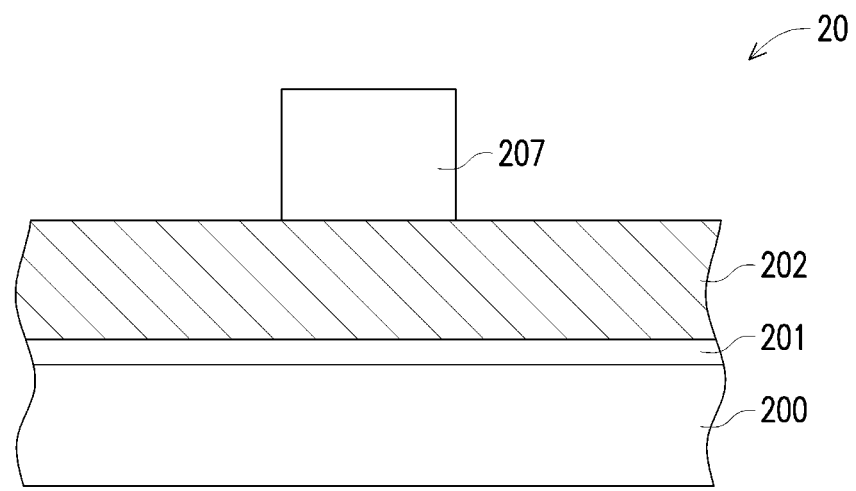

FIG. 2D is a schematic cross-sectional view of the semiconductor device 20 at one of various stages of the manufacturing method. Referring to FIG. 2D and FIG. 3, in the process step 106, the exposed photoresist layer 206 is developed by using a developer 208 and a patterned photoresist layer 207 is formed. In FIG. 2D, the patterned photoresist layer 207 is formed by removing the exposed portions 206a of the exposed photoresist layer 206 and retaining the unexposed portion 206b (FIG. 2C) on the gate material layer 202. In some embodiments, the operation of developing the exposed photoresist layer 206 is performed within a development unit 305 of the lithography tool 300 of the semiconductor processing system 30. That is, the development unit 305 is configured to perform a developing process on the exposed photoresist layer 206 to form the patterned photoresist layer 207. In some embodiments, the developer 208 includes an aqueous alkaline solution. In some embodiments, the developer 208 includes an aqueous ammonium-containing solution. In some embodiments, the developer 208 includes an aqueous solution of tetramethylammonium hydroxide (TMAH).

As illustrated in FIG. 3, the development unit 305 includes a process tank 305a and a developer supplying unit 305b for supplying the developer 208 to the process tank 305a. In some embodiments, the operation of developing the exposed photoresist layer 206 is performed within the process tank 305a of the development unit 305, and the developer 208 used to develop the exposed photoresist layer 206 is supplied form the developer supplying unit 305b. In some embodiments, the developer supplying unit 305b includes a casing 306 and a storage vessel 307 located within the casing 306. In some embodiments, the developer supplying unit 305b further includes a pump 307P for driving the gas and the flowing of the developer 208. To be more specific, the storage vessel 307 has a developer inlet 308a and a developer outlet 308b provided or installed on the storage vessel 307, while the casing 306 has a gas inlet 308c and a gas outlet 308d installed on the casing 306.

In some embodiments, the storage vessel 307 is configured to hold or store the developer 208 therein. In some embodiments, during the developing process nitrogen gas is pumped and blown into the developer supplying unit 305b through the gas inlet 308c, and, driven by the pump 307P, the developer 208 stored in the storage vessel 307 is released through the developer outlet 308b into the process tank 305a. As aforementioned, when the developer 208 includes an ammonium-containing developer or an aqueous ammonium-containing solution, an ammonia gas by-product 2081 may be generated from the developer 208 stored in the storage vessel 307. In some embodiments, the ammonia gas by-product 2081 includes ammonia gas. In some embodiments, the material of the storage vessel 307 includes polytetrafluoroethylene (PTFE), so that the storage vessel 307 is gas-permeable. During or after the process of supplying the developer 208, the ammonia gas by-product 2081 permeates out of the storage vessel 307 into the developer supplying unit 305b. Without further treatment, the ammonia gas by-product 2081 may be discharged into the chamber C of the lithography tool 300, which may trigger scum generation of the photoresist material and deteriorate the development resolution.

In some embodiments, In FIG. 2D, after the patterned photoresist layer 207 is formed, the patterned photoresist layer 207 is heated and baked by performing a post-baking process within the baking unit 303 of the lithography tool 300. At this point, the post-baking process helps harden the patterned photoresist layer 207 to withstand harsh reaction conditions to be encountered in the following processes, such as etching process, or implantation process. As shown in FIG. 2A to FIG. 2D, it is noted that, the formation of the patterned photoresist layer 207, i.e. the formation, development and patterning of the photoresist layer, is performed by using the lithography tool 300.

In some embodiments, following the operation of developing the exposed photoresist layer 206, the manufacturing method 100 of the semiconductor device 20 continues with the operation of removing the ammonia gas by-product 2081 from the lithography tool 300 in the process step 108. In some embodiments, in FIG. 3, a treating tool 310 is used to remove the ammonia gas by-product 2081 in the developer supplying unit 305b. In some embodiments, when the storage vessel 307 is refilled with the developer 208, driven by the pump 307P, the gas in the developer supplying unit 305b is purged out of the developer supplying unit 305b through the gas outlet 308d and further purged into the treating tool 310. Further, in some embodiments, the ammonia gas by-product 2081 discharged into the treating tool 310 is retained within the treating tool 310. That is, the ammonia gas by-product 2081 in the developer supplying unit 305b is removed by purging the ammonia gas by-product 2081 out of the developer supplying unit 305b of the lithography tool 300 into the treating tool 310, and then retaining the ammonia gas by-product 2081 within the treating tool 310. In some embodiments, the treating tool 310 includes an adsorptive material therein, and thereby the ammonia gas by-product 2081 is adsorbed by the adsorptive material through chemisorption or physisorption in the treating tool 310. In some embodiments, the adsorptive material is an inorganic adsorptive material, and the inorganic adsorptive material includes aluminum oxide, silica or active charcoal. In some embodiments, the adsorptive material is an organic adsorptive material, and the organic adsorptive material includes organic polymeric materials, such as Tenax, Poropak or Chromosorb. In alternative embodiments, the treating tool 310 includes a filter to filter out the ammonia gas by-product 2081.

In some embodiments, in FIG. 3, the ammonia gas by-product 2081 is discharged from the gas outlet 308d of developer supplying unit 305b into the treating tool 310 through an exhaust tool 320 connected there-between. In some embodiments, the exhaust tool 320 spatially communicates and connects the treating tool 310 and the developer supplying unit 305b of the lithography tool 300. In some embodiments, the exhaust tool 320 includes an exhaust pipe as the passage for the flowing of the gas or the ammonia gas by-product 2081. In some embodiments, the exhaust tool 320 connects the gas outlet 308d on the casing 306 of the developer supplying unit 305b and the treating tool 310. In some embodiments, the treating tool 310 is located outside of the lithography tool 300. That is, the ammonia gas by-product 2081 from the developer supplying unit 305b of the lithography tool 300 is discharged into an environment outside of the lithography tool 300 and is removed from the lithography tool 300.

In some embodiments, the manufacturing method 100 of the semiconductor device 20 includes the operation of monitoring the concentration of the ammonia gas by-product 2081 within the lithography tool 300 by using an ammonia gas monitor 330 as shown in the process step 110. Although the ammonia gas by-product 2081 is discharged into the treating tool 310 and then is retained therein, the concentration of the ammonia gas by-product 2081 within the lithography tool 300 is monitored. In some embodiments, as a precaution for the case that the ammonia gas by-product 2081 unexpectedly leaks into the chamber C of the lithography tool 300 or into the environment inside the lithography tool 300 to hinder certain processes performed in the lithography tool 300, the concentration of the ammonia gas by-product 2081 within the lithography tool 300 is monitored using an ammonia gas monitor 330. To be more specific, the removal of the ammonia gas by-product 2081 can prevent the by-product from reacting with the exposed portion 206a of the exposed photoresist layer 206 before the developing process is implemented. By doing so, the generation of scums and the incomplete reaction between the exposed portion 206a and the developer 208 owing to the presence of the ammonia gas by-product 2081 are precluded, leading to higher product yields and better development resolution and pattern fidelity.

In certain embodiments, the ammonia gas monitor 330 is a real-time ammonia gas monitor. To be more specific, the ammonia gas monitor 330 is used to real-time monitor whether the concentration of the ammonia gas by-product 2081 within the lithography tool 300 stays lower than a concentration threshold. That is, the ammonia gas monitor 330 is used to determine whether the concentration of the ammonia gas by-product 2081 within the lithography tool 300 is lower than such concentration threshold. If the ammonia gas monitor 330 detects that the concentration of the ammonia gas by-product 2081 within the lithography tool 300 is lower than such concentration threshold, the method 100 proceeds to perform the process step 102 again. Further, if the ammonia gas monitor 330 detects that the concentration of the ammonia gas by-product 2081 within the lithography tool 300 is higher (i.e. not lower than) than such concentration threshold, the ammonia gas monitor 330 that is coupled with the control module 309 sends an alert signal to the control module 309 of the lithography tool 300. In some embodiments, after receiving the alert signal, the control module 309 may control the lithography tool 300 entering into a pause mode, halting to the operation of the coating unit 302, the baking unit 303, the exposure unit 304 and/or the development unit 305 of the lithography tool 300. In some embodiments, while the control module 309 controls the lithography tool 300 entering into a pause mode, the ammonia gas monitor 330 keeps monitoring the concentration of the ammonia gas by-product 2081 within the lithography tool 300. In certain embodiments, for the lithography tool 300 in the pause mode, the operation of removing the ammonia gas by-product 2081 from the lithography tool 300 keeps going to lower the concentration of the ammonia gas. In some embodiments, a gas removal tool (not shown), disposed in the chamber C of the lithography tool 300, may additionally be used to remove the ammonia gas by-product 2081 from the lithography tool 300. In some embodiments, when the ammonia gas monitor 330 detects that the concentration of the ammonia gas by-product 2081 within the lithography tool 300 is again lower than such concentration threshold, the method 100 is resumed. In one embodiment, the concentration threshold of the ammonia gas by-product 2081 is about 2 parts per billion (ppb). In some embodiments, the ammonia gas monitor 330 is disposed near to the gas outlet 308d connected with the exhaust tool 320.

Figure 4:
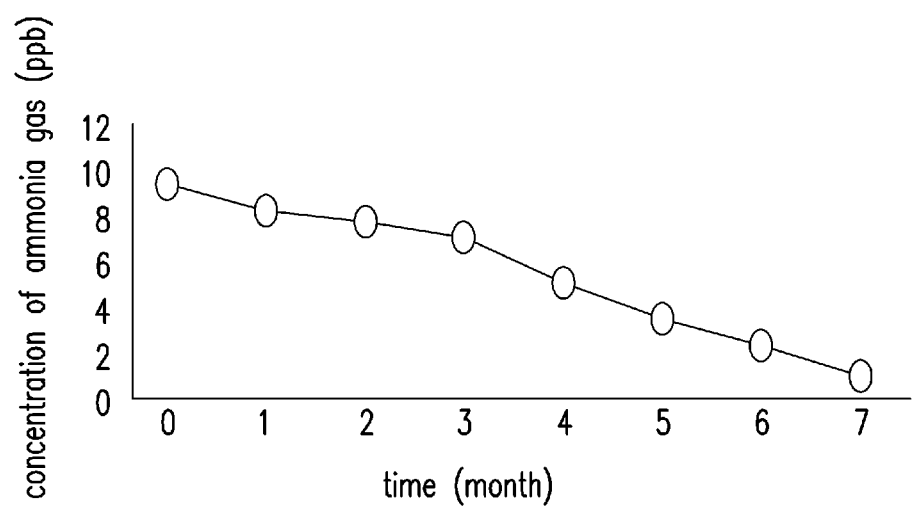
FIG. 4 is a diagram showing the relationship between the processing time and a concentration of an ammonia gas by-product within a lithography tool of a semiconductor processing system in accordance with some embodiments of the present disclosure.

FIG. 4 is a diagram showing the relationship between the processing time and a concentration of an ammonia gas by-product within a lithography tool of the semiconductor processing system 30 in accordance with some embodiments of the present disclosure. In certain embodiments, in the situation that the ammonia gas by-product 2081 within the developer supplying unit 305b of the lithography tool 300 is removed by the treating tool 310, and the concentration of the ammonia gas by-product 2081 within the lithography tool 300 keeps reducing until the concentration threshold is reached. With reference to the manufacturing method and the semiconductor processing system as described in the above embodiments, it is shown that the concentration of the ammonia gas by-product detected by the ammonia gas monitor keeps reducing from the initial concentration of about 9.4 ppb to the concentration lower than 2.0 ppm (even as low as about 1.0 ppb) over a period of time. That is, regarding the semiconductor processing system described above to implement the lithography process for several months, the concentration of the ammonia gas by-product within the lithography tool detected by the ammonia gas monitor can be reduced significantly to a value even lower than the concentration threshold. On the other hand, if the ammonia gas by-product is not further treated and is discharged into the environment inside the lithography tool, the detected concentration of the ammonia gas by-product within the lithography tool may be relatively high (e.g. more than 10.8 ppb).

Figure 2E:
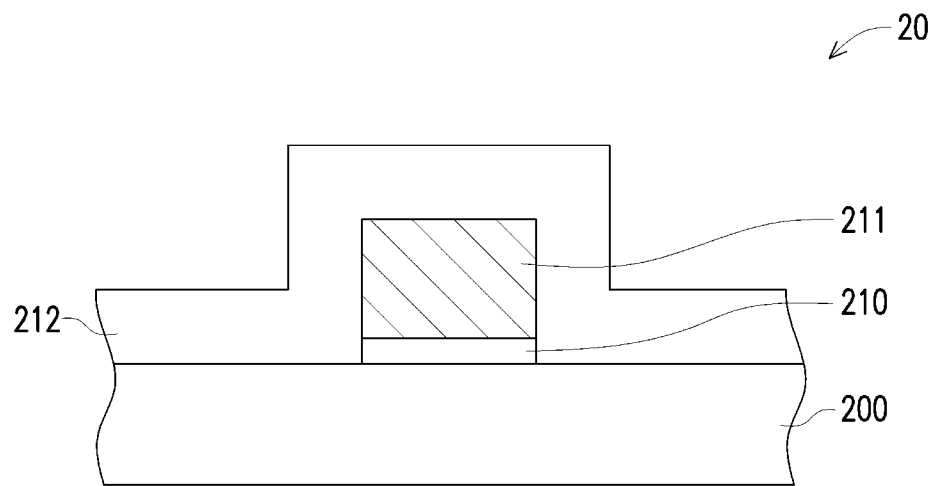

In some embodiments, following the process step shown in FIG. 2D, the patterned photoresist layer 207 is used as an etch mask, and the gate material layer 202 and the dielectric material layer 201 are etched to form a gate dielectric layer 210 and a gate 211 in FIG. 2E by performing an etching process. In some embodiments, the etching process includes a dry etching process. Further, in some embodiments, after the gate dielectric layer 210 and the gate 211 are formed, the patterned photoresist layer 207 is removed by performing a wet photoresist etching process or a dry photoresist etching process.

Further, referring to FIG. 2E, a spacer material layer 212 is formed over the substrate 200, wherein the spacer material layer 212 covers the gate dielectric 210 and the gate 211. In some embodiments, the spacer material layer 212 includes $SiO_2$, $SiO_x$, SiN, other dielectric materials, combinations thereof or multiple layers thereof. In some embodiments, the spacer material layer 212 is formed by CVD or other methods. In alternatively embodiments, the spacer material layer 212 may include other materials and may be formed using other methods.

Figure 2F:
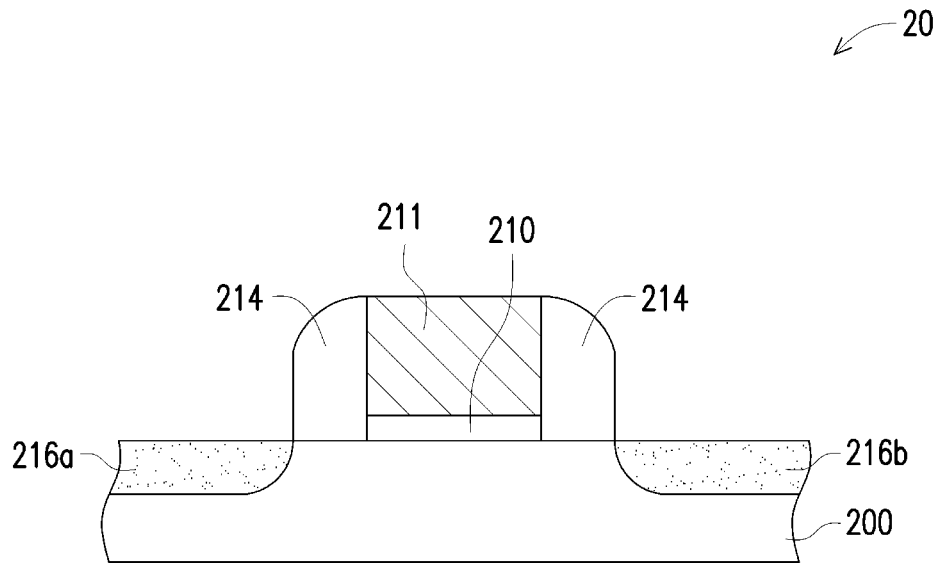

Referring to FIG. 2E and FIG. 2F, the spacers 214 are formed on the sidewalls of the gate dielectric layer 210 and the gate 211 by performing an etching back process to partially remove the spacer material layer 212. In some embodiments, the etching back process includes an anisotropic etching process. Further, referring to FIG. 2F, source and drain regions 216a and 216b are formed in the substrate 200 by performing an implantation process. In some embodiments, the implantation process includes performing an ion implantation process. In some embodiments, the implantation process includes implanting dopant ions in the substrate 200 beside the spacers 214 and by both sides of the stack of the gate dielectric layer 210 and the gate 211. In some embodiments, the dopant ions are p-type dopant ions, such as boron, $BF_2^+$, and/or a combination thereof. In some alternative embodiments, the dopant ions are n-type dopant ions, such as phosphorus, arsenic, and/or a combination thereof.

Hereby, the exemplary manufacturing method for forming the semiconductor device 20 on the substrate 200 is described. In some embodiments, the semiconductor device 20 is a p-channel metal oxide semiconductor (PMOS) device. In some alternative embodiments, the semiconductor device 20 is an n-channel MOS (NMOS) device. As aforementioned, the semiconductor processing system 30 can be used in the manufacturing method of the semiconductor device 20 for implementing the lithography process.

Referring to FIG. 3, the semiconductor processing system 30 including the lithography tool 300 and the treating tool 310 is illustrated. In some embodiments, the lithography tool 300 includes the housing H, the coating unit 302, the backing unit 303, the exposure unit 304, the development unit 305, and the control module 309, and the coating unit 302, the backing unit 303, the exposure unit 304, and the development unit 305 are located within a chamber C defined by the housing H. In some embodiments, the control module 309 is located within the chamber C of the lithography tool 300. However, the control module 309 may be located outside the chamber C of the lithography tool 300, depending on the design of the system. In some embodiments, in FIG. 3, the development unit 305 includes the process tank 305a and the developer supplying unit 305b connected with the process tank 305a. In some embodiments, the coating unit 302, the backing unit 303, the exposure unit 304, and the process tank 305a of the development unit 305 are installed within a process station 301. In some embodiments, the process station 301 is coupled with the control module 309, and the processing and transferring of the substrate or the wafer between different units, i.e. the coating unit 302, the backing unit 303, the exposure unit 304, and the process tank 305a of the development unit 305, in the process station 301 may be controlled by the control module 309. In some embodiments, the coating unit 302, the backing unit 303, the exposure unit 304 and the process tank 305a of the development unit 305 are coupled with one another such that substrates need to be processed may be transferred and processed between them.

In some embodiments, the developer supplying unit 305b is located outside the process station 301. In some embodiments, the developer supplying unit 305b includes a casing 306, a storage vessel 307, a developer inlet 308a, a developer outlet 308b, a gas inlet 308c and a gas outlet 308d. In some embodiments, the treating tool 310 is located outside the chamber C of the lithography tool 300. In some embodiments, the semiconductor processing system 30 further includes the exhaust tool 320 disposed between the developer supplying unit 305b of the lithography tool 300 and the treating tool 310 to connect the developer supplying unit 305b and the treating tool 310. In one embodiment, the exhaust tool 320 includes an exhaust pipe and is connected to the gas outlet 308d through a connector. In another embodiment, the exhaust tool 320 is integrally formed with the gas outlet 308d of the developer supplying unit 305b.

In some embodiments, the semiconductor processing system 30 further includes the ammonia gas monitor 330. In some embodiments, the ammonia gas monitor 330 is located within the chamber C of the lithography tool 300 and coupled with the control module 309 of the lithography tool 300. As aforementioned, in some embodiments, the ammonia gas monitor 330 is configured to monitor the concentration of the ammonia gas by-product inside the chamber C of the lithography tool 300. In certain embodiments, the ammonia gas monitor 330 is a real-time ammonia gas monitor and is disposed near to the gas outlet 308d or near the exhaust tool 320.

In the above embodiments, for the manufacturing method of the semiconductor device 20 using the semiconductor processing system 30, the ammonia gas by-product 2081 of the developer 208 generated from the development unit 305 is removed by discharging the ammonia gas by-product 2081 out the development unit 305 of the lithography tool 300 and then retaining in the treating tool 310. Owing to the operation of removing the ammonia gas by-product 2081 of the developer 208 from the lithography tool 300, the risk of generating the scum due to the reaction of the ammonia gas by-product 2081 and the exposed portion 206a is reduced. Accordingly, the pattern transfer fidelity and the product yield of the semiconductor device 20 are improved.

In accordance with some embodiments of the present disclosure, a method of manufacturing a semiconductor device is as below. A photoresist layer is formed on a substrate in a lithography tool. The photoresist layer is exposed in the lithography tool to form an exposed photoresist layer. The exposed photoresist layer is developed to form a patterned photoresist layer in the lithography tool by using a developer. An ammonia gas by-product of the developer is removed from the lithography tool.

In accordance with alternative embodiments of the present disclosure, a method of manufacturing a semiconductor device is as below. A lithography tool having a coating unit, an exposure unit, a development unit is provided. A photoresist layer is formed on a substrate in the coating unit. The photoresist layer is exposed in the exposure unit to form an exposed photoresist layer. The exposed photoresist layer is developed to form a patterned photoresist layer in the development unit by using a developer. An ammonia gas by-product of the developer is discharged from the development unit into a treating tool. The ammonia gas by-product is retained in the treating tool. A concentration of the ammonia gas by-product within the lithography tool is monitored.

In accordance with yet some other alternative embodiments of the present disclosure, a semiconductor processing system includes a lithography tool, a treating tool, an exhaust tool and an ammonia gas monitor. The lithography tool includes a coating unit, an exposure unit, and a development unit located within a chamber of the lithography tool. The treating tool is disposed outside the chamber of the lithography tool. The exhaust tool is disposed between the lithography tool and the treating tool to connect the lithography tool and the treating tool. The ammonia gas monitor is located within the chamber of the lithography tool and coupled with the lithography tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    providing a lithography tool having a coating unit, an exposure unit, a development unit, wherein the development unit includes a process tank and a developer supplying unit for supplying a developer to the process tank;
    forming a photoresist layer on a substrate in the coating unit;
    exposing the photoresist layer in the exposure unit to form an exposed photoresist layer;
    developing the exposed photoresist layer using the developer supplied by the developer supplying unit to form a patterned photoresist layer in the process tank;
    discharging an ammonia gas by-product of the developer from the developer supplying unit of the development unit into a treating tool;
    retaining the ammonia gas by-product in the treating tool; and
    monitoring a concentration of the ammonia gas by-product within the lithography tool.

2. The method of claim 1, wherein forming a photoresist layer comprises forming a positive type photoresist layer.

3. The method of claim 1, wherein a material of the photoresist layer comprises poly (4-t-butoxycarbonyloxystyrene), polymethylmethacrylate (PMMA), or tetrafluoroethylene (TFE).

4. The method of claim 1, wherein the developer comprises an aqueous solution of tetramethylammonium hydroxide (TMAH).

5. The method of claim 1, wherein the ammonia gas by-product is discharged through an exhaust tool into the treating tool located outside of the lithography tool.

6. The method of claim 1, wherein retaining the ammonia gas by-product comprises providing an adsorptive material in the treating tool for adsorbing the ammonia gas by-product.

7. The method of claim 1, wherein monitoring a concentration of the ammonia gas by-product comprises real-time monitoring the ammonia gas by-product using a real-time ammonia gas monitor.

8. A semiconductor processing system, comprising:
    a lithography tool, wherein the lithography tool includes a coating unit, an exposure unit, and a development unit located within a chamber of the lithography tool, the development unit comprises a developer supplying unit, and the developer supplying unit comprises a gas outlet;
    a treating tool, disposed outside the chamber of the lithography tool;
    an exhaust tool, disposed between the lithography tool and the treating tool to connect the lithography tool and the treating tool, wherein the exhaust tool includes an exhaust pipe connecting the gas outlet of the developer supplying unit and the treating tool; and
    an ammonia gas monitor, located within the chamber of the lithography tool and coupled with the lithography tool.

9. The semiconductor processing system of claim 8, wherein the ammonia gas monitor is disposed near to the gas outlet.

10. The semiconductor processing system of claim 9, wherein the ammonia gas monitor is a real-time gas monitor.

11. The semiconductor processing system of claim 8, wherein the treating tool includes an adsorptive material therein for adsorption ammonia gas.

12. The semiconductor processing system of claim 8, wherein the developer supplying unit includes a casing and a storage vessel located within the casing, and the gas outlet is installed on the casing.

13. A method of manufacturing a semiconductor device, comprising:
    providing a lithography tool having a coating unit, an exposure unit, a development unit, wherein the development unit includes a developer supplying unit for supplying a developer, and the developer supplying unit comprises a gas outlet;
    forming a photoresist layer on a substrate in the coating unit;
    exposing the photoresist layer in the exposure unit to form an exposed photoresist layer;
    developing the exposed photoresist layer using the developer supplied by the developer supplying unit to form a patterned photoresist layer in the development unit;
    discharging an ammonia gas by-product of the developer from the development unit by an exhaust tool through the gas outlet of the developer supplying unit into a treating tool, wherein the exhaust tool includes an exhaust pipe connecting the gas outlet of the developer supplying unit and the treating tool;
    retaining the ammonia gas by-product in the treating tool; and
    monitoring a concentration of the ammonia gas by-product by an ammonia gas monitor within the lithography tool.

14. The method of claim 13, wherein the ammonia gas monitor is disposed near to the gas outlet.

15. The method of claim 13, wherein forming a photoresist layer comprises forming a positive type photoresist layer.

16. The method of claim 13, wherein a material of the photoresist layer comprises poly (4-t-butoxycarbonyloxystyrene), polymethylmethacrylate (PMMA), or tetrafluoroethylene (TFE).

17. The method of claim 13, wherein the developer comprises an aqueous solution of tetramethylammonium hydroxide (TMAH).

18. The method of claim 13, wherein the ammonia gas by-product is discharged through the exhaust tool into the treating tool located outside of the lithography tool.

19. The method of claim 13, wherein retaining the ammonia gas by-product comprises providing an adsorptive material in the treating tool for adsorbing the ammonia gas by-product.

20. The method of claim 13, wherein monitoring a concentration of the ammonia gas by-product comprises real-time monitoring the ammonia gas by-product using a real-time ammonia gas monitor.

* * * * *